RE 25,574

June 6, 1961 E. W. MANTEUFFEL 2,987,666

SOLID STATE POWER STAGE AMPLIFIER EMPLOYING SILICON RECTIFIERS AND HALF-CYCLE RESPONSE MAGNETIC AMPLIFIERS

Filed Feb. 2, 1959

Inventor:
Erich W. Manteuffel,
by [signature]
His Attorney.

United States Patent Office 2,987,666 Patented June 6, 1961

2,987,666

SOLID STATE POWER STAGE AMPLIFIER EMPLOYING SILICON RECTIFIERS AND HALF-CYCLE RESPONSE MAGNETIC AMPLIFIERS

Erich W. Manteuffel, Ithaca, N.Y., assignor to General Electric Company, a corporation of New York Filed Feb. 2, 1959, Ser. No. 790,623
8 Claims. (Cl. 323—58)

This invention relates to power amplifiers of the type which provide an output signal of variable magnitude and polarity, and more particularly to a solid-state power stage amplifier which exploits the characteristics of controlled silicon rectifiers.

Many of the prior art magnetic amplifiers used at the present time for producing an output signal of variable magnitude and polarity require the use of power reactors. The weight and volume of such bulky power reactors is highly undesirable where the use of the amplifier in an aircraft or like vehicle is contemplated. Moreover, in many of these prior art amplifiers which provide two stages of amplification, separate balancing of the individual stages is necessary. The internal losses encountered in these prior art magnetic amplifiers are very appreciable if they are designed to function properly with a reasonable temperature rise.

The present invention contemplates a new solid-state power stage amplifier capable of producing an output voltage of variable magnitude and polarity for use by components such as two-phase servomotors. According to the inventive concept, the properties of the recently developed controlled silicon rectifier are exploited. Such rectifiers are capable of being gated conductive at any given instant during the alternating current cycle. To those skilled in the art, an analogy between this property of controlled silicon rectifiers and conventional grid controlled thyratron tubes will immediately present itself. This analogy is accurate, in that the controlled silicon rectifier does actually comprise the solid-state counterpart of a conventional grid controlled gaseous conduction device. By employing this particular phenomenon of solid-state conduction, relatively large amounts of power can be controlled. The use of such controlled silicon rectifiers has the virtue of providing a magnetic amplifier with a physical size and weight which is negligible in comparison to the weight and size of a conventional magnetic amplifier having an equivalent power handling capacity. The internal losses associated with a circuit which utilizes such rectifiers are practically negligible compared to the power losses which characterize either conventional thyratron or magnetic power amplifiers designed for the same temperature rise and corresponding weight or volume.

In practicing the present invention, four controlled silicon rectifiers in a bridge type configuration are gated by small magnetic half-cycle response amplifiers. By utilizing a center tapped output transformer, an output signal of controllable magnitude and polarity is obtained by gating the control windings of the half-cycle response amplifiers with an A.C. control signal of predetermined amplitude and polarity. The magnetic amplifier thus provided yields a very large power gain at response times of one-half cycle of conventional supply frequency. By using the inventive amplifier for controlling an element such as a two-phase servomotor, the need for bulky power reactors previously required in conventional known power amplifiers is completely eliminated. It will thus be appreciated that both the weight and volume of the proposed system are significantly less than that which characterizes prior art magnetic amplifier type units.

Moreover, since the controlled rectifiers used in the present invention fire in exact synchronism with the half-cycle response magnetic amplifiers, the problem of separately balancing the individual stages of the two-stage magnetic amplifiers is entirely avoided. This is due in part to the fact that the different signals in the power stage amplifier of the present invention are electrically isolated from each other.

Accordingly, therefore, a primary object of the present invention is to provide a solid-state power stage amplifier which exploits the properties of controlled silicon rectifiers for producing an output potential of variable magnitude and polarity.

Another object of the present invention is to teach a combination of circuitry and components in which half-cycle response magnetic amplifiers are used in conjunction with controlled silicon rectifiers for providing output signals of predetermined magnitude and polarity.

Still another object of the present invention is to provide method and means for accomplishing power amplification in which the bulky power reactors of the prior art systems are eliminated with attendant elimination of balance problems, and in which substantial power gain at half-cycle response is achieved.

A further object of this invention is to disclose a new bridge-type amplifier circuit incorporating controlled silicon rectifiers which are gated conductive at an instant during the alternating current supply wave which is determined by the bias level of a plurality of individual half-cycle magnetic amplifiers.

A further object of this invention is to provide bridge-type circuitry utilizing a number of controlled silicon rectifiers adapted to experience conduction therethrough in response to the bias control setting of a plurality of saturable reactors connected to influence the control electrodes of said rectifiers.

A still further object of the present invention is to teach a method and means for deriving a voltage of controllable magnitude and polarity in accordance with the magnitude and polarity of a gating control signal which is supplied to a group of saturable reactors employed in initiating conduction through a plurality of controlled silicon rectifiers.

These and other objects and advantages of the present invention will become apparent by referring to the accompanying detailed description and drawings in which like numerals indicate like parts, and in which.

Figure 1:
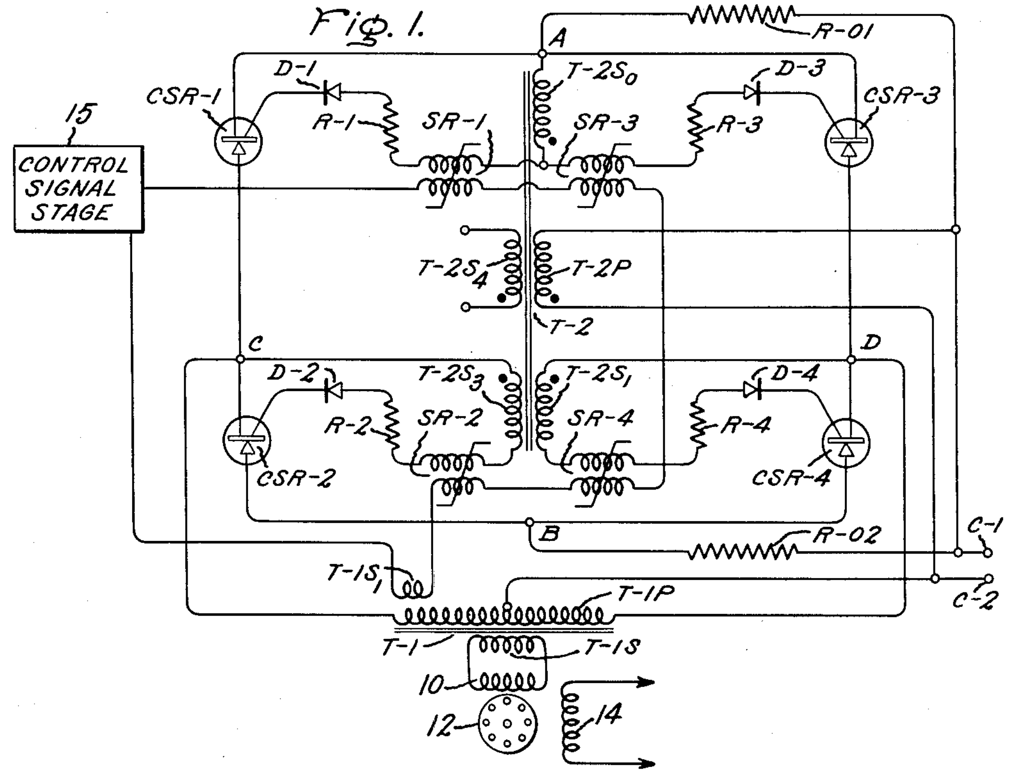
FIGURE 1 illustrates the circuitry and components of a bridge-type circuit which uses controlled silicon rectifiers and magnetic half-cycle response amplifiers to provide a solid-state power stage amplifier according to the teachings of the present invention.

Turning now to the detailed description of the invention, and more particularly to FIGURE 1 of the accompanying drawings, the reference characters C–1 and C–2 have been used in this figure to identify a set of contacts which may be connected to a source of sinusoidal supply voltage of suitable amplitude and frequency. The contacts C–1 and C–2 are connected to apply alternating current energy to a bridge circuit configuration having four connection points identified by the reference letters A, B, C and D. Thus, the contact C–1 is coupled to the connection point B through a current limiting resistor R—O2. This contact is also tied to the connection point A in the upper portion of the drawing through a current limiting resistor R—O1.

Directly beneath the connection point B in FIGURE 1, there is illustrated a transformer T–1, which is provided with a center tapped primary winding T–1P. This transformer is also equipped with a secondary winding T–1S, and the secondary winding T–1S is connected to supply energy to the control field 10 of a conventional two-phase servomotor 12. The servomotor 12 is provided with the usual reference field 14.

The servomotor 12 is of conventional construction and design, and is characterized by the ability to rotate in either clockwise or counterclockwise direction. The direction of rotation of the motor is governed by the polarity of the field current which is supplied to the control field 10. In practicing the present invention, the direction of current flow through the control field 10 may be reversed by adjusting the magnitude of the gating control signals which are applied to the control windings of a plurality of saturable reactors, in a manner to be explained more fully later in the present specification.

Returning now to the detailed description of FIGURE 1, it will be observed that the contact C–2 in the right-hand portion of the drawing is conductively connected to the center tap of the primary winding T–1P of transformer T–1. In addition, one end of the primary winding T–1P is tied directly to the connection point C for the bridge circuit shown immediately thereabove, while the opposite end of primary winding T–1P is connected to the connection point D in the right side of the bridge circuit.

The bridge-type circuit in FIGURE 1 will also be seen to include a plurality of controlled silicon rectifiers which have been identified by the reference characters CSR–1, CSR–2, CSR–3 and CSR–4. The first of these rectifiers CSR–1 is located between the connection points C and A and is poled to conduct current when positive potential is applied to the anode of the rectifier identified by the arrow symbol, and when positive potential is applied to the gate electrode of the unit with respect to the cathode. The flow of such current will, in the case of CSR–1, as in all other cases, be in the direction of the arrow.

Directly beneath the rectifier CSR–1, a controlled silicon rectifier CSR–2 is located between the connection points B and C, and is poled to conduct current in the direction indicated by the arrow symbol when positive voltage is applied to this element, and the gate electrode of the rectifier is gated to initiate conduction therethrough.

The controlled silicon rectifier CSR–3 is coupled between the connection points D and A in FIGURE 1 and is poled to conduct current under proper conditions in the direction indicated by the arrow symbol. In like manner, the controlled silicon rectifier identified by the reference character CSR–4 is tied between the connection points B and D and is similarly poled when gated conductive to allow current flow in the direction indicated by the arrow symbol.

Continuing with the detailed description of the invention, the reference character T–2 has been used in FIGURE 1 to identify an auxiliary transformer illustrated in the central portion of the drawing. This transformer is provided with a primary winding which is designated T–2P and is also provided with a plurality of secondary windings identified generally by the designation T–2S, with an appropriate subscript appended to this designation. The several secondary windings of the transformer T–2 identified in this manner will be seen to include a secondary winding T–$2S_0$ located in the upper portion of the drawing in proximity to connection point A. In the lower right-hand central portion of the bridge circuit there is illustrated another secondary winding T–$2S_1$. Immediately to the left of this winding there is shown still another secondary winding T–$2S_3$. In the left central portion of the bridge circuit across from the primary winding T–2P there is finally illustrated secondary winding T–$2S_4$. This winding is to be used for supplying current to the bias windings (not shown) of four saturable reactors to be described next.

The power stage amplifier circuitry of the present invention also employs a plurality of half-cycle response magnetic amplifiers, each of which take the form of a saturable reactor equipped with a gate winding, a control winding for receiving a control current and a conventional bias winding. In this patent specification, the terms saturable reactor and half-cycle response magnetic amplifier are frequently used interchangeably, and will be understood to mean the same thing. In order to avoid needlessly complicating the drawing of the circuitry and components in FIGURE 1, the bias windings for the several saturable reactors have not been illustrated.

The half-cycle response magnetic amplifiers, or saturable reactors as they are referred to interchangeably in the present specification, are identified in the power amplifier bridge circuit by the reference characters SR–1, SR–2, SR–3 and SR–4.

The location and interconnection details of these reactors is as follows. In the upper left-hand corner of the bridge circuit, the gate winding of the saturable reactor SR–1 is connected in an individual series circuit which includes a current limiting resistor R–1, a silicon diode or like device D–1, and the gate and cathode terminals of the silicon rectifier CSR–1. The series circuit for this gate winding also includes the transformer winding T–$2S_0$ which, as will be recalled from the earlier portion of the specification, comprises one of the secondary windings of the auxiliary transformer T–2. It will be observed that one end of the secondary winding T–$2S_0$ is tied to the connection point A and therefore to the cathode terminal of $CSR_1$ shown immediately thereabove.

The saturable reactor SR–2 is located in the lower left central portion of FIGURE 1 and will be seen to comprise one of a series of elements connected in an individual series circuit. This series circuit includes the current limiting resistor R–2, the silicon diode or like device D–2, the gate and cathode terminals of the silicon rectifier CSR–2, and the secondary winding T–$2S_3$.

In the upper right-hand portion of the bridge circuit, the operating winding of the saturable reactor SR–3 is connected in an individual series circuit which includes a current limiting resistor R–3, a silicon diode or equivalent type device D–3, the gate and cathode terminals of the silicon rectifier CSR–3, and the secondary winding T–$2S_0$ of the auxiliary transformer T–2.

Lastly, the operating winding of the saturable reactor SR–4 will be seen to form one element in an individual series circuit illustrated in the lower right central portion of the bridge circuit in FIGURE 1. More particularly, the saturable reactor SR–4 is connected in series with a current limiting resistor R–4, a diode or equivalent element D–4, the gate and cathode terminals of the silicon rectifier CSR–4, and the secondary winding T–$2S_1$ of the auxiliary transformer T–2.

In continuing the detailed description of the mode of connection of the saturable reactors, reference to the means for providing control current to the control windings of the several saturable reactors will now be made. The control windings of the saturable reactors SR–1 and SR–3 in the upper portion of FIGURE 1 are connected in series with the control windings of saturable reactors SR–4 and SR–2 depicted in the lower portion of the bridge circuit. A winding T–$1S_1$ disposed to receive energy by induction from the transformer T–1 is also connected in series with the control windings for the reactors SR–1, SR–2, SR–3 and SR–4. The circuit which defines this series loop is connected to receive energy from a control signal stage 15 shown in the left-hand portion of the illustration. The control signal stage 15 may be of conventional construction and detail, and is capable of providing an output signal of variable amplitude and polarity to the series-connected control windings of the several saturable reactors. This output signal may be fixed, or relatively constant, or may comprise a condition responsive potential which alters the amplitude and polarity of the output bridge power available at the secondary winding of transformer T–1.

The winding T–$1S_1$ shown in inductive proximity to the transformer T–1 serves to introduce a compensating voltage into the series circuit for the control windings. This compensating voltage is proportional to the load voltage and is provided in order to eliminate influences on the wave shape of the control current from the gate currents of the saturable reactors. The provision for the auxiliary winding T–$1S_1$ in this manner also has the effect of increasing the total amplification afforded by the power stage amplifier of the present invention.

Having discussed the type of elements employed in the bridge circuit of FIGURE 1, along with the specific mode of interconnecting such elements, the detailed description of the manner of operation of the bridge-type power amplifier will now be provided. In readying the bridge circuit of FIGURE 1 for operation, it is desirable to regulate the value of the bias current which flows through the bias windings (not shown) of the saturable reactors in order to establish a quiescent operating point for the power amplifier. By adjusting the value of this current in the bias windings of the four reactors SR–1, SR–2, SR–3 and SR–4, the reactors are set to initiate conduction through the respective controlled silicon rectifiers at the 90° point on the sine wave of alternating current supply voltage. In setting this quiescent operating point, the reactors SR–1 and SR–3 are biased to initiate conduction at 90 electrical degrees during the positive half-cycle of potential. The reactors SR–2 and SR–4, on the other hand, effect initiation of current flow through the associated controlled silicon rectifiers after 90° of the corresponding negative half-cycle has elapsed. This value would of course correspond to 270° measured from the time origin. As earlier mentioned in the present patent specification, the bias windings for the several saturable reactors are of conventional construction and have been omitted from the drawing in FIGURE 1 for the purpose of clarity.

Proceeding with the explanation of the theory of operation, it should be appreciated that the four half-cycle magnetic amplifiers comprising saturable reactors SR–1 through SR–4, the respective silicon diodes D–1 through D–4 and the current limiting resistors R–1 through R–4 serve to regulate the controlled silicon rectifiers CSR–1 through CSR–4 by determining the instants of firing. The manner in which this is done, and the analogy to the operation of a grid-controlled thyratron rectifier device will be abundantly evident to those skilled in the art in the light of the portions of the detailed description which follow.

In FIGURE 1, the response to the various controlled silicon rectifiers and saturable reactors to the successive cycles of supply voltage occurs in this manner. When the positive cycle of sine wave voltage is applied to the contacts C–1 and C–2 (contact C–2 polarized positively with respect to contact C–1), positive potential is supplied directly to the center tap of the primary winding T–1P of transformer T–1. This positive potential is applied through one-half of the primary winding to the connection point C and from thence to the anode of the controlled silicon rectifier CSR–1 identified by the arrow symbol. At this time, current is prevented from traversing the controlled silicon rectifier and reaching the connection point A, because the rectifier has not yet been gated conductive by the action of the individual control loop which includes the saturable reactor SR–1.

During this same half-cycle of positive polarity, the positive voltage existent at contact C–2 is applied via the center tap of primary winding T–1P to the connection point D on the right-hand side of the bridge, and is thereby simultaneously present at the anode of the rectifier CSR–3 identified by the arrow symbol. Once again, current cannot traverse the rectifier CSR–3 and reach the connection point A, because the rectifier has not been gated conductive by potentials within the series loop which includes the saturable reactor SR–3.

At any time during this interval of time, the simultaneous gating of rectifiers CSR–1 and CSR–3 to the conductive state will cause current to flow from contact C–2 to the center-tap of the primary winding. This current divides and flows in opposite directions through both halves of the tapped primary winding of T–1 to the respective connection points C and D. From these points, the current flows through the rectifiers CSR–1 and CSR–3 respectively to the connection point A, and from the connection point A back through current limiting resistor R—O1 to the negative contact C–1.

The mechanism of gating the controlled silicon rectifiers to the conductive state in this fashion is as follows: In FIGURE 1, the secondary winding T–$2S_0$ has a voltage of predetermined magnitude induced in itself by the inductive transfer from the primary winding of the transformer T–2. In the early instants of the time interval under consideration, the volt-time integral applied to the gate winding of saturable reactor SR–1 is not large enough to cause saturation of SR–1 and therefore to initiate flow of current in the individual loop which includes the diode D–1 and the gate winding of the saturable reactor SR–1. As the amplitude of the positive cycle of supply voltage increases, the voltage induced into the secondary winding T–$2S_0$ will similarly increase. When this voltage reaches a critical magnitude whose value is determined by the current through the bias winding of the saturable reactor SR–1, this reactor becomes saturated and current flows in the series loop which includes the resistor R–1, the diode device D–1, and the gate electrode of rectifier CSR–1. As soon as this current flows, the rectifier CSR–1 is gated conductive, and current from contact C–2 is able to flow through the left-hand portion of the primary winding of transformer T–1 to the connection point C, through rectifier CSR–1 to point A, and back to C–1. This is because the element CSR–1 after gating no longer appears as a practically infinite impedance to the flow of current.

The mechanism by which the controlled silicon reactor CSR–3 is rendered conductive is substantially the same. The rising magnitude of positive voltage existent in the transformer winding T–$2S_0$ reaches a critical point where it is possible to drive current through the saturated impedance presented by the gate winding of the saturable reactor SR–3. At this instant, current traverses resistor R–3, the diode D–3, the control electrode of the controlled silicon rectifier CSR–3 and closes upon itself via connection point A.

This mode of firing the silicon rectifiers is somewhat analogous to the operation of a grid controlled thyratron tube. With a given value of biasing potential on the grid of a thyratron, conduction through the tube is characteristically initiated at a specific point on the A.C. sine wave of applied anode potential. In the bridge-type circuit shown in FIGURE 1, the instant at which the controlled silicon rectifiers fire is controlled in a similar fashion. Thus, any of the saturable reactors such as the saturable reactor SR–1 may be provided with a current in the bias winding which causes the reactor to saturate and present negligible A.C. impedance at any given instant of the applied alternating voltage wave. When this occurrence takes place, the previous impedance of an element such as SR–1 is reduced to a substantially smaller value. At this time, the induced voltage in the secondary winding T–$2S_0$ is adequate for driving current through the resistor R–1, the diode D–1 and the gate electrode of the rectifier CSR–1, for the purpose of gating the rectifier conductive. By this means, the exact instant of firing with respect to the loop of applied sinusoidal voltage can be determined simply by adjusting the level of the current which flows in the biasing winding of the saturable reactor element.

With the background of this explanation, reference will now be made to the wave form shown in FIGURE 2. This wave form shows the conduction pediods which characterize the quiescent operating level of the power stage amplifier. The positive half-cycle of sine wave voltage in this figure represents the condition when contact C–2 is polarized positively with respect to contact C–1. As this positive half-cycle of supply voltage rises and reaches a given point, the controlled silicon rectifier CSR–1 is caused to fire as a result of current flow in the loop which contains the reactor SR–1. An instant later, the controlled silicon rectifier CSR–3 is caused to experience conduction. Although the firing instants of these two rectifiers in FIGURE 2 have been shown to occur at slightly different instants of time, for purposes of illustration, both rectifiers would be adjusted by means of the bias currents to fire e.g. at exactly 90° on the sine wave.

When this happens, it means that the primary winding of transformer T–1 experiences current flow outwardly from the center tap in opposing directions for equal time intervals. This means that the magnetizing forces which are generated exactly cancel each other, and no energy can be transferred by induction into the secondary winding for the purpose of energizing the control field 10 of the servomotor 12. In other words, the electrical conduction intervals which occur when reactors SR–1 and SR–3 are both biased to fire at 90° on the positive cycle have the effect of preventing the application of power to the servomotor 12. This is because the supply current enters through contact C–2, arrives at the center tap of the primary winding, divides exactly in half and flows in opposite directions for equal time intervals in order to reach conduction points C and D. From these points, the equal halves of the current traverse the respective rectifiers CSR–1 and CSR–3 to reunite at the connection point A and return as an entity to contact C–1. When the uppermost pair of controlled silicon rectifiers in FIGURE 1 are biased in this manner to fire simultaneously at 90° positive, the ampere-turns generated in the primary winding of the transformer T–1 are subtractive and can effect no transformer action for the purpose of inducing a voltage into the secondary winding of the transformer T–1. As a result, no current is present in the secondary winding of transformer T–1 for application to the control winding of the servomotor 12.

When the controlled silicon rectifier CSR–1 is biased to fire earlier in the sine wave than the rectifier CSR–3, the net electrical effect is markedly different. Current flow then occurs between the center tap of the primary winding and the connection point C, through the rectifier CSR–1 to the connection point A, and back to contact C–1. At this time the primary ampere-turns are unopposed by any subtractively polarized ampere-turns capable of effecting a net cancellation of all flux. A finite interval thereafter, the initiation of conduction through the rectifier CSR–3 permits current flow through the line which includes the opposite half of the tapped primary winding T–1P. However, for a controlled interval, the flux generated within the left-hand portion of the primary winding has been allowed to cut the secondary winding T–1S of transformer T–1 and induce a voltage therein. As a result, power is applied to the control field of the servomotor 12 for this finite interval. When conduction through CSR–3 is initiated, the resulting flow of current through the right-hand portion of the tapped primary winding gives rise to a cancellation of primary ampere-turns for the remaining portions of the half-cycle. Therefore no voltage can exist on the secondary winding of transformer T–1.

Figure 3:
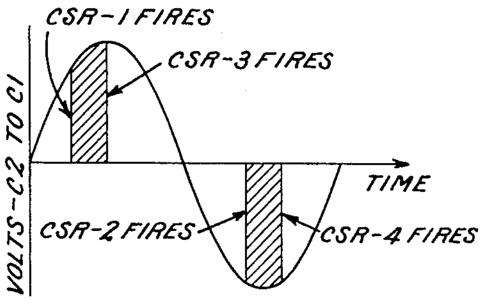
FIGURE 3 illustrates a wave form diagram of the conduction periods which occur when the saturable reactors are gated to initiate conduction through the controlled silicon rectifiers at predetermined instants of time.

The conduction periods which occur when the saturable reactor SR–1 is gated to permit conduction prior to the commencement of conduction in rectifier CSR–3 are illustrated in FIGURE 3 of the drawings. In this figure it will be noted that rectifier CSR–1 has been gated conductive as an example at about 45 electrical degrees, while the rectifier CSR–3 remains nonconductive until approximately the 90° point on the positive cycle of the sine wave. By this means, an electrical unbalance in the primary winding of transformer T–1 is caused to occur, and a transfer of energy into the secondary winding of the transformer T–1 is effected.

Returning to the detailed description of FIGURE 1, the conduction paths which occur during the negative half-cycle of sine wave supply voltage will now be explained. The conditions which exist during the quiescent operating stage will first be set forth. More particularly, when the contact C–2 becomes negative with respect to contact C–1, the conduction path is as follows. Current enters at contact C–1 and reaches the connection point B after traversing a current limiting resistor R—O2. From the connection point B, the current attempts to reach and traverse both the controlled silicon rectifier CSR–2 in the left-hand portion of the drawing and the controlled rectifier CSR–4 in the right-hand portion of the drawing. Conduction through both rectifiers is impossible however, until the appropriate gating signal has been applied to these rectifiers for the purpose of rendering them conductive. Once such signal has been applied, the current is of course then capable of traversing the rectifiers.

In the left-hand portion of the drawing, the path of this current is from connection point B through rectifier CSR–2 to connection point C, back through the primary winding of transformer T–1 as far as the center tap, and thence to contact C–2. The other conduction path extends from connection point B through rectifier CSR–4 to the connection point D; back through the primary winding of transformer T–1 as far as the center tap, and thence back to contact C–2. Once again, during this conduction interval, the primary winding of transformer T–1 experiences a flow of current in opposite directions from equal time intervals. The flow of these currents of identical magnitude in opposite directions results in a subtractive ampere-turns relationship in transformer T–1 which effectively prevents the induction of voltage in the secondary of the transformer during the quiescent operating condition.

It should be appreciated that the symmetrical condition explained immediately above is that which occurs when the saturable reactors SR–2 and SR–4 are adjusted by means of the current in their bias windings to simultaneously fire at e.g. 90 electrical degrees on the negative half-cycle of sinusoidal supply voltage. This is indicated somewhat diagrammatically in FIGURE 2 for the purposes of illustration. It will be appreciated that the firing points of CSR–2 and CSR–4 in FIGURE 2 would in practice actually coincide at 90° negative.

When the rectifier CSR–2 is biased to fire a predetermined number of electrical degrees ahead of the reactor CSR–4, a net unbalance of current in the primary winding of the transformer T–1 occurs with respect to time, and the transfer of energy by induction to the control field of the servomotor 12 is effected in exactly the same manner as described in connection with the operation of the rectifiers CSR–1 and CSR–3 in the upper portion of FIGURE 1.

Continuing with the detailed description of the invention, reference to the control signal stage 15 will now be made. The gating of the several controlled silicon rectifiers for conduction at 90°, as earlier mentioned represents the quiescent operating level of the solid-state power amplifier. In order to cause the servomotor 12 to rotate in either of two directions for controlled intervals of time, the firing points of the controlled silicon rectifiers CSR–1 and CSR–2 may be regulated to cause these rectifiers to fire earlier in time than the reactors CSR–3 and CSR–4. This may be repetitively accomplished during each successive half-cycle of sine wave voltage by means of the control signal stage 15. Although some control over the firing points of the reactors may be accomplished by regulating the degree of saturation in the cores by means of the bias windings, a more sophisticated measure of control over the firing points is afforded by the signal stage 15. A current of predetermined magnitude and polarity from stage 15 may circulate through the several series-connected control windings supplied from the signal stage 15. With this current the cores of such reactors may be caused to saturate, time-wise, at a point on the A.C. sine wave which is controlled by the value of the current supplied from the signal stage. By this means, moreover, the output current provided by the control signal stage 15 is capable of driving the cores of the respective saturable reactors into saturation at any predetermined point on the A.C. sine wave. This means that as the magnitude of the potential induced in a secondary winding such as $T\text{–}2S_0$ is gradually increasing, the effective impedance of a saturable reactor such as SR–1 can be sharply reduced with attendant gating of the associated rectifier to the conductive state at any point on the alternating current wave. The induced voltage in the secondary winding is then immediately capable of driving current through the current limiting resistor R–1, the diode D–1 and the control electrode for the purpose of gating the rectifier conductive. If the output voltage from the signal stage 15 is increased in amplitude, the conduction periods shown in FIGURE 3 expand symmetrically about the 90° point until at maximum signal the sinusoidal wave shape is finally approached in either positive or negative phase.

Figure 4:
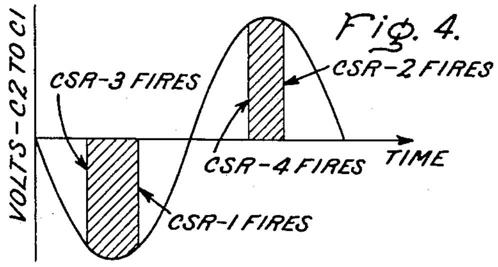
FIGURE 4 shows a wave form of the conduction periods and firing sequence which occurs when the polarity of the gating signals for the saturable reactors is reversed.

If the polarity of the control signal from the signal control stage 15 is reversed, then the reactors SR–3 and SR–4 fire earlier in time than the reactors SR–1 and SR–2 and, correspondingly, the controlled silicon rectifiers CSR–3 and CSR–4 are switched on earlier than the counterpart elements CSR–1 and CSR–2. The result will be a phase reversal of the output voltage appearing across the control field winding of the servomotor 12 because of the connection of the center tapped transformer T–1 to the bridge and the supply contacts. This condition of phase reversal is shown in FIGURE 4. The significance of this condition is that the direction of the torque supplied by the servomotor 12 can be reversed by reversing the polarity of the output voltage produced by the control signal stage 15.

In conclusion, the following summary of the operation of the circuit may be made. The reactors SR–1 and SR–3 in FIGURE 1 may be used to switch on the controlled silicon rectifiers CSR–1 and CSR–3 simultaneously at 90° firing angle during the positive half-cycle when terminal C–2 is positive with respect to terminal C–1. This sets the quiescent operating point for the amplifier. Conversely, the rectifiers CSR–1 and CSR–3 are cut off during the negative half-cycle of supply voltage. The supply voltage appears across the resistor R—O1 during the positive half-cycle and no induced voltage is produced across the secondary winding of transformer T–1.

During the negative half-cycle when terminal C–1 is positive with respect to terminal C–2, the reactors SR–2 and SR–4 act to switch on the rectifiers CSR–2 and CSR–4 simultaneously at 90° firing angle. From the foregoing description, it will be recalled that these rectifiers have been cut off during the previous positive half-cycle. The supply voltage during the negative half-cycle appears across current limiting resistor R—O2, and no induced voltage is present across the terminals of the secondary winding of the transformer T–1.

Figure 2:
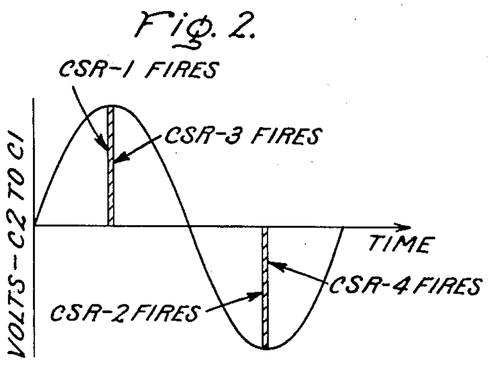
FIGURE 2 illustrates a wave form diagram of the conduction periods which characterize the quiescent operating level of the power stage amplifier.

When an A.C. control signal is applied through the control windings for reactors SR–1 through SR–4 to fire reactors SR–1 and SR–2 earlier in time than reactors SR–3 and SR–4 during the succeeding half-cycles as shown in FIGURE 2, the rectifiers CSR–1 and CSR–2 conduct earlier in time than the rectifiers CSR–3 and CSR–4, to permit energy transfer by induction to the output terminals of transformer T–1.

During the time which elapses between the switching on of rectifiers CSR–1 and CSR–3 and the respective rectifiers CSR–2 and CSR–4, the output voltage which appears across the windings of the transformer T–1 effects this transfer of energy to the control field of the servomotor 12. As earlier explained in this specification, this condition is illustrated in FIGURE 3 by hatched areas which represent the induced voltage available at the output terminals of transformer T–1. The output voltage derived by reversing the polarity of the signal from the control signal stage 15 is illustrated by the hatched areas shown in FIGURE 4 of the accompanying drawings.

There has been described one embodiment of a newly developed power stage amplifier incorporating controlled silicon rectifiers used in conjunction with half-cycle response magnetic amplifiers and a center tapped output transformer for the purpose of producing an output signal of predetermined polarity and magnitude. Although the use of such signals in driving a reversible servomotor has been explained in completing the detailed description of the invention, it will be appreciated that this type of signal may be used for many other applications which require potential of variable magnitude and polarity, and that such use of the circuitry would fall squarely within the spirit and scope of the appended claims.

What I claim is:

1. In a solid-state power stage amplifier circuit for producing an output signal of controllable magnitude and polarity, contact means connected to receive power from a source of alternating voltage, bridge circuit means including two pairs of oppositely poled rectifiers connected to define a set of four individual connection points therebetween, a transformer provided with a primary winding having a center tap contact, a first group of conductors connected to couple said center tap contact to one of said contact means and the opposite ends of said primary winding to a first pair of said individual connection points, a second group of conductors connected to couple the other of said contact means to a second pair of said connection points, and means including saturable reactor means connected each to sample said alternating voltage and initiate conduction through each of said rectifiers at a predetermined instant during the successive half-cycles of said voltage.

2. In a solid-state power stage amplifier circuit for producing an output signal of predetermined magnitude and polarity, contact means connected to receive power from a source of alternating voltage; a first pair of similarly poled normally nonconductive rectifiers coupled in series with a first connection point therebetween, a second pair of similarly poled normally nonconductive rectifiers coupled in series with a second connection point therebetween, said first and second pairs of rectifiers coupled together to provide third and fourth connection points therebetween; a transformer provided with a center tapped primary winding and means coupling the opposite ends of said winding across said first and second connection points respectively, first conductor means coupling one of said contact means to the center tap of said primary winding, second conductor means coupling the other of said contact means to said third and fourth connection points, and means including saturable reactor means connected to render each of said rectifiers conductive at a predetermined instant during the successive half-cycles of said alternating voltage.

3. In a solid-state power stage amplifier circuit for producing an output signal of predetermined magnitude and polarity, contact means connected to receive power from a source of alternating voltage; a first pair of similarly poled normally nonconductive rectifiers coupled in series with a first connection point therebetween, a second pair of similarly poled normally nonconductive rectifiers coupled in series with a second connection point therebetween, said first and second pairs of rectifiers coupled together to provide third and fourth connection points therebetween, each of said rectifiers provided with a control electrode for receiving a voltage impulse to render said rectifier conductive; a transformer provided with a center tapped primary winding and means coupling opposite ends of said winding across said first and second connection points respectively, first conductor means coupling one of said contact means to the center tap of said primary winding, second conductor means coupling the other of said contact means to said third and fourth connection points, and means including diode means and saturable reactor means connected in-circuit with each of said control electrodes for said rectifiers for rendering said rectifiers conductive at a predetermined instant during the successive half-cycle of said alternating voltage.

4. In a solid-state power stage amplifier circuit for producing an output signal of predetermined magnitude and polarity, contact means connected to receive power from a source of alternating voltage; a first pair of similarly poled normally nonconductive rectifiers coupled in series with a first connection point therebetween, a second pair of similarly poled normally nonconductive rectifiers coupled in series with a second connection point therebetween, said first and second pairs of rectifiers coupled together to provide third and fourth connection points therebetween, each of said rectifiers provided with a control electrode for receiving a voltage impulse to render said rectifier conductive; a transformer provided with a center tapped primary winding and means coupling opposite ends of said winding across said first and second connection points respectively, first conductor means coupling one of said contact means to the center tap of said primary winding, second conductor means coupling the other of said contact means to said third and fourth connection points, a second transformer connected to sample said alternating voltage and induce potential within a plurality of individual secondary windings, and means including diode means and a saturable reactor connected in circuit between each of said control electrodes and opposite ends of one of said secondary windings for rendering said rectifiers conductive at a predetermined instant during the successive half-cycles of said alternating voltage.

5. In a solid-state power stage amplifier circuit for producing an output signal of predetermined magnitude and polarity, contact means connected to receive power from a source of alternating voltage; bridge circuit means including two pairs of oppositely poled rectifiers connected to define a set of four individual connection points therebetween, each of said rectifiers provided with a control electrode for receiving gating potential to initiate conduction therethrough; a transformer provided with a primary winding having a center tap contact, a first group of conductors connected to couple said center tap contact to one of said contact means and the opposite ends of said primary winding to a pair of said individual connection points, a second group of conductors connected to couple the other of said contact means to a second pair of said connection points, and means including saturable reactor means connected each to sample said alternating voltage and apply gating potential to said control electrodes to initiate conduction through said rectifiers at predetermined instants during the successive half-cycles of said alternating voltage.

6. In a solid-state power stage amplifier circuit for producing an output signal of predetermined magnitude and polarity, contact means connected to receive power from a source of alternating voltage, bridge circuit means including two pairs of oppositely poled rectifiers connected to define a set of four individual connection points therebetween, a transformer provided with a primary winding having a center tap contact, a first group of conductors connected to couple said center tap contact to one of said contact means and the opposite ends of said primary winding to a pair of said individual connection points, a second group of conductors connected to couple the other of said contact means to a second pair of said connection points, and means including diode means and a plurality of individual saturable reactor means each having a gate winding connected to selectively apply gating potential to one of said rectifiers at a predetermined instant during the successive half-cycles of said alternating voltage to initiate conduction therethrough.

7. In a solid-state power stage amplifier circuit for producing an output signal of predetermined magnitude and polarity, contact means connected to receive power from a source of alternating voltage, bridge circuit means including two pairs of oppositely poled rectifiers connected to define a set of four individual connection points therebetween, a transformer provided with a primary winding having a center tap contact, a first group of conductors connected to couple said center tap contact to one of said contact means and the opposite ends of said primary winding to a pair of said individual connection points, a second group of conductors connected to couple the other of said contact means to a second pair of said connection points, means including diode means and a plurality of individual saturable reactor means each having a gate winding connected to selectively apply gating potential to one of said rectifiers at a predetermined instant during the successive half-cycles of said alternating voltage to initiate conduction therethrough, and means including a signal control stage connected to supply current of predetermined amplitude and polarity to the control windings of each of said individual saturable reactor means to fix said predetermined instant at which said conduction through said rectifiers is initiated.

8. In a solid state power amplifier circuit for producing an output signal of controllable magnitude and polarity, a source of alternating voltage, bridge circuit means including four silicon controlled rectifiers each having a cathode, an anode and gate electrode, a first connection point represented by the cathode electrodes of two of said rectifiers connected in common, a second connection point formed by the anode electrodes of two of the other of said rectifiers connected in common, third and fourth connection points being the remaining common connections between the anode and cathode electrodes, a transformer having a primary winding with a center tap contact, said center tap contact being connected to one side of said source of alternating voltage, the ends of said primary winding being connected to said third and fourth connection points, said first and second connection points each resistively connected to said source of alternating voltage, and means including diodes and saturable reactors connected to each gate electrode of said controlled rectifiers, each of said last named means being for sampling said alternating voltage and initiating conduction through each of said controlled rectifiers at a predetermined instant during successive half-cycles of said voltage.

References Cited in the file of this patent

UNITED STATES PATENTS

| | | |
|---|---|---|
| 2,510,652 | Parson | June 6, 1950 |
| 2,708,718 | Weiss | May 17, 1955 |
| 2,728,046 | Sciaky | Dec. 20, 1955 |
| 2,821,639 | Bright et al. | Jan. 28, 1958 |

OTHER REFERENCES

"Magnetic-Amplifier Circuits" by Geyger, 1954, McGraw-Hill Co., Inc., 1st Ed., page 149, Fig. 10.2 and page 205, Fig. 14.3*b*.

"Solid-State Thyratron Switches Kilowatts" by Frenzel and Gutzwiller, Electronics (Mar. 28, 1958).

"Notes on the application of the Silicon Controlled Rectifier" (EGG-371-1) December 1958.